(12) United States Patent
Schuberth

(10) Patent No.: US 11,555,878 B2
(45) Date of Patent: Jan. 17, 2023

(54) CURRENT-MEASURING TRANSDUCER DEVICE HAVING A CURRENT-MEASURING TRANSDUCER AND METHOD FOR CALIBRATING A CURRENT-MEASURING TRANSDUCER

(71) Applicant: SIEMENS AKTIENGESELLSCHAFT, Munich (DE)

(72) Inventor: Stefan Schuberth, Lichtenfels (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/266,686

(22) PCT Filed: Jul. 9, 2019

(86) PCT No.: PCT/EP2019/068329
§ 371 (c)(1),
(2) Date: Feb. 8, 2021

(87) PCT Pub. No.: WO2020/030360
PCT Pub. Date: Feb. 13, 2020

(65) Prior Publication Data
US 2021/0311154 A1  Oct. 7, 2021

(30) Foreign Application Priority Data
Aug. 7, 2018 (DE) ...................... 10 2018 213 203.8

(51) Int. Cl.
*G01R 15/24* (2006.01)
*G01R 33/032* (2006.01)
(Continued)

(52) U.S. Cl.
CPC ......... *G01R 35/005* (2013.01); *G01R 15/183* (2013.01); *G01R 15/20* (2013.01); *G01R 15/246* (2013.01)

(58) Field of Classification Search
CPC .... G01R 15/183; G01R 15/20; G01R 15/246; G01R 35/005
See application file for complete search history.

(56) References Cited

U.S. PATENT DOCUMENTS 3,324,393 A * 6/1967 Casey .................. G01R 15/246
250/225
3,605,013 A    9/1971 Yoshikawa et al.
(Continued)

FOREIGN PATENT DOCUMENTS

| DE | 2548278 A1 | 5/1977 |
| GB | 2228337 A | 8/1990 |
| WO | 2015051983 A1 | 4/2015 |

*Primary Examiner* — Alesa Allgood
(74) *Attorney, Agent, or Firm* — Laurence A. Greenberg; Werner H. Stemer; Ralph E. Locher

(57) ABSTRACT

A current-measuring transducer device has a current transducer for measuring an electric current along a conduction path. The current transducer has a magnetic field-sensitive element for converting the magnetic field resulting from the current flow along the conduction path into at least one physical variable and a measuring device for measuring the physical variable. The current transducer device has a coil arrangement with at least one coil for simulating the magnetic field resulting from the current flow along the conduction path. There is also described a method for calibrating a corresponding current transducer and a computer program product for performing the calibration method.

10 Claims, 1 Drawing Sheet

(51) Int. Cl.
    *G01R 35/00*     (2006.01)
    *G01R 15/18*     (2006.01)
    *G01R 15/20*     (2006.01)

(56) References Cited

U.S. PATENT DOCUMENTS

| | | |
|---|---|---|
| 4,797,607 A | 1/1989 | Dupraz |
| 4,999,571 A | 3/1991 | Ishiko et al. |
| 2015/0002137 A1 | 1/2015 | Patel et al. |
| 2015/0108967 A1* | 4/2015 | Barczyk ............... G01R 15/183 324/202 |
| 2015/0160298 A1* | 6/2015 | Tabatowski-Bush ....................... G01R 15/183 324/426 |
| 2016/0167540 A1 | 6/2016 | Tabatowski-Bush |
| 2016/0320434 A1 | 11/2016 | Pascal et al. |

\* cited by examiner

CURRENT-MEASURING TRANSDUCER DEVICE HAVING A CURRENT-MEASURING TRANSDUCER AND METHOD FOR CALIBRATING A CURRENT-MEASURING TRANSDUCER

BACKGROUND OF THE INVENTION

Field of the Invention

The invention relates to a current transducer device having a current transducer for measuring an electric current along a conduction path, wherein the current transducer has a magnetic field-sensitive element for converting the magnetic field resulting from the current flow along the conduction path into at least one physical variable and a measuring device for measuring this physical variable.

The invention furthermore relates to a method for calibrating a current transducer for measuring an electric current along a conduction path, which has a magnetic field-sensitive element for converting the magnetic field resulting from the current flow along the conduction path into a physical variable, and to a corresponding computer program product for performing the method.

A current transducer device of the type mentioned at the outset is known from document U.S. Pat. No. 3,605,013 A as a magneto-optical current transducer. A fiber-optic coil serves there as magnetic field-sensitive element and converts the magnetic field resulting from the current flow along the conduction path into a change in the polarization state of laser light that passes through the fiber-optic coil. An analyzer-detector arrangement serves as measuring device. A current transducer device that operates on the basis of a highly similar measuring principle is disclosed in document DE 25 48 278 A1.

In contrast to inductive current transformers in accordance with the transformer principle (hereinafter referred to as conventional current transducers), in which the electric current to be determined along the conduction path results from the current measured on the secondary side and the turns ratio between the primary and secondary side, non-conventional current transducers, such as for example the abovementioned magneto-optical current transducer, have to be routinely calibrated.

SUMMARY OF THE INVENTION

The object of the invention is to specify measures for the simple and reliable calibration of the current transducer.

The object is achieved by the features of the independent claims. Advantageous refinements are specified in the dependent claims.

In the current transducer device according to the invention having a current transducer for measuring an electric current along a conduction path, which has a magnetic field-sensitive element for converting the magnetic field resulting from the current flow along the conduction path into at least one physical variable and a measuring device for measuring the physical variable, there is provision for this current transducer device to furthermore have a coil arrangement for simulating the magnetic field resulting from the current flow along the conduction path, which coil arrangement comprises at least one coil.

To calibrate the current transducer of the current transducer device, the coil arrangement present in the current transducer device may be used to generate a magnetic field that is equivalent to the magnetic field resulting from the current flow along the conduction path. The components required for the calibration are thus already present in the current transducer device, and so no additional structure has to be provided for the calibration. Furthermore, the components made available here use the turns ratio (number of turns in the current path to number of turns in the coil assembly of the coil arrangement) in accordance with the transformer principle for calibration.

There is in particular provision for the device-internal arrangement and orientation of the coil arrangement to be fixedly predefinable or fixedly predefined with respect to the magnetic field-sensitive element.

According to one preferred refinement of the invention, there is provision for the magnetic field-sensitive element to have a coil or ring or frame shape. Such a shape is required in particular for straight-through transformers.

According to a further preferred refinement of the invention, the coil or at least one of the coils surrounds the magnetic field-sensitive element at least in sections. In the case of a coil or ring or frame shape of the magnetic field-sensitive element, the term section refers to the circumferential sections of the coil, ring or frame shape.

According to yet another preferred embodiment of the invention, there is provision for the magnetic field-sensitive element to be an optically active element and/or a magnetizable element.

There is advantageously provision for the at least one physical variable to be
 a variable describing the state of the optically active element with respect to an optical property and/or
 a variable describing the state of the magnetizable element with respect to a magnetic property.

In a further advantageous refinement, there is provision for the current transducer device to have a current generator for energizing the at least one coil for simulating the magnetic field resulting from the current flow along the conduction path.

Finally, with regard to the current transducer device, there is advantageously provision for it to have a control and/or regulation device for performing a calibration process for calibrating the current transducer. This is generally connected to the measuring device and the current generator in order to exchange signals. The control and/or regulation device is preferably a computer-based control and/or regulation device.

In the method according to the invention for calibrating a current transducer for measuring an electric current along a conduction path, which has a magnetic field-sensitive element for converting the magnetic field resulting from the current flow along the conduction path into a physical variable, there is provision, in order to calibrate the current transducer, for the magnetic field resulting from the current flow along the conduction path to be simulated by way of a coil arrangement comprising at least one coil.

There is in particular provision for the current transducer to be part of an abovementioned current transducer device and for the coil arrangement of this current transducer device to be used to simulate the magnetic field.

In the case of the computer program product according to the invention, there is provision for this to comprise program portions that are designed to be loaded in a processor of a computer-based control and/or regulation device so as to perform the abovementioned method.

Exemplary embodiments of the invention are shown schematically hereinafter in drawings and described in more detail below. In the figures:

DETAILED DESCRIPTION OF THE INVENTION

Figure 1:
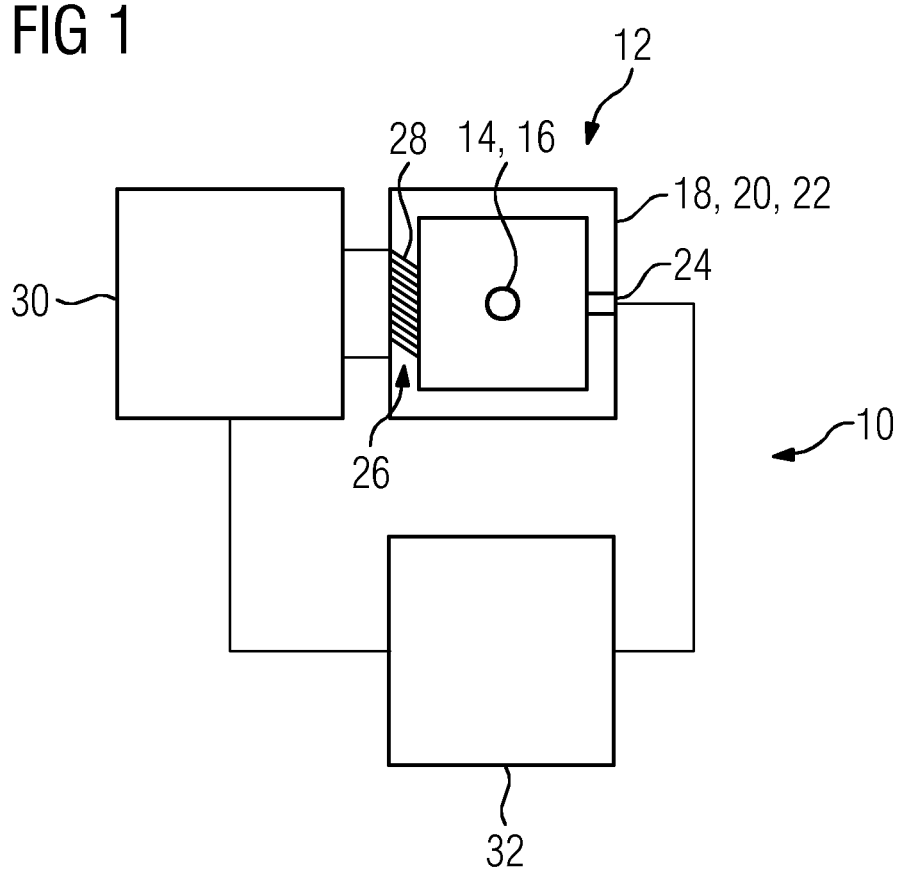
FIG. 1 shows an arrangement consisting of a conduction path and current transducer device according to one preferred embodiment of the invention.

FIG. 1 shows a current transducer device 10, the central component of which is the actual current transducer 12 for measuring an electric current along a conduction path 14. This conduction path 14 arises for example along an electrical conductor 16. The current transducer 12 has a magnetic field-sensitive element 18 for converting the magnetic field resulting from the current flow along the conduction path 14 into at least one other physical variable. The magnetic field-sensitive element 18 is a ferromagnetic magnetizable element 20 that has a ring or frame shape, through which the electrical conductor 16 is guided. The magnetizable element 20 is designed as a type of toroidal core 22, and the current transducer 12 shown here is what is known as a straight-through transformer for a conduction path 14 that runs essentially in a straight line. As an alternative, however, the conduction path 14 could also run differently in the measuring area, for example wound in a coil shape.

The current transducer 12 also has a measuring device 24 attached to the magnetic field-sensitive element 18 for measuring the physical variable provided by the magnetic field-sensitive element 18. In the example shown here, the measuring device 24 is a magnetic field sensor that is arranged in a gap in the ring-shaped or frame-shaped ferromagnetic magnetizable element 20 and is designed as a Hall sensor. Such a magnetic field sensor measures the magnetic flux density B as physical variable. Alternative types of magnetic field sensors are Förster probes and XMR sensors, that is to say magnetoresistive sensors such as GMR, AMR or CMR sensors.

In addition to these components of the current transducer 12, the current transducer device 10 also has a coil arrangement 26 having one or more coils 28. In the example shown here in FIG. 1, there is only a single coil 28. This surrounds a circumferential section of the ring-shaped or frame-shaped ferromagnetic magnetizable element 20 that forms a coil core, more precisely the toroidal core 22, with respect to the coil 28. By virtue of the coil arrangement 26, it is possible to simulate the magnetic field resulting from the current flow along the conduction path 14 and thus to easily calibrate the current transducer in a highly precise manner. In this case too, the ratio between the current through the coil 28 and the simulated electric current along the conduction path 14 (with the turns number N=1) results directly from the number of turns in the coil 28.

The coil arrangement 26 furthermore has connections (not shown here) for the connection of a current generator 30 for energizing the at least one coil 28. As an alternative or in addition, the current transducer device 10 also has this current generator. The current transducer device 10 furthermore also additionally has a control and/or regulation device 32 for performing a calibration process for calibrating the current transducer 12. This is generally connected to the measuring device 24 and the current generator 30 in order to exchange signals. The control and/or regulation device 32 is preferably a computer-based control and/or regulation device.

This results in the following function:

To calibrate the current transducer 12 of the current transducer device 10, a magnetic field resulting from the current flow along the conduction path 14 is simulated by way of the coil arrangement 26 installed fixedly in the current transducer device 10.

This results in the following advantages:

The components required for the calibration are already present in the current transducer device 10, and so no structure has to be provided for the calibration. Furthermore, the components made available here then use the turns ratio (number of turns in the current path to number of turns in the coil assembly of the coil arrangement) in accordance with the transformer principle for calibration.

In other words: For non-conventional current transducers 12 that do not operate in accordance with the transformer principle like inductive current transformers and therefore have to be calibrated, the advantages of the transformer principle are then used during calibration.

Figure 2:
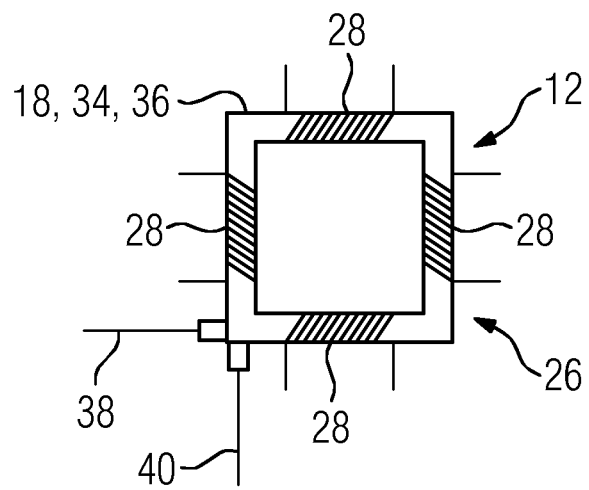
FIG. 2 shows parts of a current transducer device according to a further preferred embodiment of the invention.

FIG. 2 shows an alternative refinement of the current transducer device 10. The current transducer 12 of this current transducer device 10 is a magneto-optical current transducer similar to the magneto-optical current transducer from document U.S. Pat. No. 3,605,013 A mentioned at the outset.

The magnetic field-sensitive element 18 is an optically active element 34 that is shaped as a ring element 36. The underlying effect is for example the Faraday effect, and the resulting variable is a rotation of a polarization plane or another measurable change in a polarization property. Light having known polarization properties is introduced into the ring element 36 via an optical input 38 and then guided out of the ring element 36 via an optical output 40 and supplied to the measuring device 24, which is designed as a polarization analyzer.

The coil arrangement 26 of the embodiment shown in FIG. 2 has a plurality of coils 28. In this embodiment of the current transducer 12, this is necessary in order to generate a sufficient change in the polarization property of the light (for example rotation of the polarization plane).

LIST OF REFERENCE SIGNS 10 current transducer device
12 current transducer
14 conduction path
16 electrical conductor
18 magnetic field-sensitive element
20 magnetizable element
22 toroidal core
24 measuring device
26 coil arrangement
28 coil
30 current generator
32 control and/or regulation device
34 optically active element
36 ring element
38 optical input
40 optical output

The invention claimed is:

1. A current transducer device, comprising:
a current transducer for measuring an electric current along a conduction path, said current transducer having a magnetic field-sensitive element for converting a magnetic field resulting from a current flow along the conduction path into at least one physical variable and a measuring device for measuring the physical variable, said magnetic field-sensitive element being an optically active element; and a coil arrangement having at least one coil, said coil arrangement being configured for simulating the magnetic field resulting from the current flow along the conduction path, said at least one coil being one of a plurality of coils and at least one of said coils surrounding said magnetic field-sensitive element at least in sections thereof and being configured for generating a change in the polarization property of the light.

2. The current transducer device according to claim 1, wherein a device-internal arrangement and orientation of said coil arrangement is fixedly predefined with respect to said magnetic field-sensitive element.

3. The current transducer device according to claim 1, wherein said magnetic field-sensitive element has a shape selected from the group consisting of a coil, a ring, and a frame.

4. The current transducer device according to claim 1, wherein said at least one coil surrounds said magnetic field-sensitive element at least in sections thereof.

5. The current transducer device according to claim 1, wherein said magnetic field-sensitive element is a magnetizable element.

6. The current transducer device according to claim 1, further comprising a current generator for energizing said at least one coil for simulating the magnetic field resulting from the current flow along the conduction path.

7. The current transducer device according to claim 1, further comprising a control and/or closed-loop control device for performing a calibration process for calibrating the current transducer.

8. A method for calibrating a current transducer for measuring an electric current along a conduction path, the method comprising:

providing a current transducer, the current transducer being a part of a current transducer device according to claim 1, with a magnetic field-sensitive element for converting a magnetic field resulting from an electric current flow along the conduction path into a physical variable;

calibrating the current transducer by simulating the magnetic field resulting from the current flow along the conduction path by way of a coil arrangement having at least one coil.

9. The method according to claim 8, wherein the calibrating step comprises using the coil arrangement of the current transducer device to simulate the magnetic field.

10. A non-transitory computer program product comprising program portions that are configured to be loaded into a processor of a computer-based control and/or closed-loop control device in order to perform the method according to claim 8.

* * * * *